(12) United States Patent
Hutton et al.

(10) Patent No.: US 7,368,942 B1
(45) Date of Patent: May 6, 2008

(54) DEDICATED RESOURCE INTERCONNECTS

(75) Inventors: Michael D. Hutton, Mountain View, CA (US); Bruce B. Pedersen, Sunnyvale, CA (US); James G. Schleicher, II, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 67 days.

(21) Appl. No.: 11/351,882

(22) Filed: Feb. 9, 2006

(51) Int. Cl.
*H03K 19/177* (2006.01)

(52) U.S. Cl. .......................................... 326/41; 326/38

(58) Field of Classification Search ................. 326/37, 326/38, 39, 40, 41, 46, 47; 708/490, 501, 708/503
See application file for complete search history.

(56) References Cited

U.S. PATENT DOCUMENTS

| | | | |
|---|---|---|---|
| 6,411,124 B2 | 6/2002 | Lee et al. | |
| 6,462,577 B1 | 10/2002 | Lee et al. | |
| 6,504,398 B1 * | 1/2003 | Lien et al. | 326/41 |
| 6,538,470 B1 | 3/2003 | Langhammer et al. | |
| 6,566,906 B1 | 5/2003 | Hwang et al. | |
| 6,628,140 B2 | 9/2003 | Langhammer et al. | |
| 6,693,455 B2 | 2/2004 | Langhammer et al. | |
| 6,771,094 B1 | 8/2004 | Langhammer et al. | |
| 6,781,408 B1 | 8/2004 | Langhammer et al. | |
| 6,857,043 B1 | 2/2005 | Lee et al. | |
| 6,882,177 B1 * | 4/2005 | Reddy et al. | 326/45 |
| 6,978,287 B1 | 12/2005 | Langhammer | |
| 2005/0187998 A1 | 8/2005 | Zheng et al. | |

FOREIGN PATENT DOCUMENTS

WO    WO 02/33504 A2    4/2002

* cited by examiner

*Primary Examiner*—Daniel Chang
(74) *Attorney, Agent, or Firm*—Robert R. Jackson; Ropes & Gray LLP

(57) ABSTRACT

The present invention, generally speaking, relates to taking advantage of existing outputs from logic groupings that neighbor a digital signal processing block in a programmable logic device to expand the functionality of the digital signal processing block. The outputs from the logic groupings are used as dedicated routing interconnects that provide additional inputs into the digital signal processing block (e.g., into function specific blocks) such that the signal processing block receives additional signals. These additional signals can be input into the signal processing block via the dedicated routing interconnect without significant addition of input interconnection resources that are silicon-area expensive.

23 Claims, 10 Drawing Sheets

DEDICATED RESOURCE INTERCONNECTS

BACKGROUND OF THE INVENTION

As applications for which programmable logic devices (PLDs) are used increase in complexity, it has become more common to design PLDs to include "function-specific blocks" (FSBs) in addition to blocks of generic programmable logic resources. Typically, an FSB is a concentration of circuitry on a PLD that has been partly- or fully-hard-wired to perform one or more specific tasks, such as a logical or a mathematical operation. An FSB may also contain one or more specialized structures, such as an array of configurable memory elements. Examples of structures that are commonly implemented as FSBs include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

While the availability of FSBs on a PLD may lessen the need for programmably implementing such structures in soft-logic (e.g., by piecing together and configuring several blocks of generic programmable logic resources), the nature of the functions implemented in FSBs are often those which require inputs and/or outputs that are several bits wide (i.e., multi-bit signals). As a result, significant interconnection resources may be required simply for routing input and output signals to and from FSBs. The need for interconnection resources may be further compounded when FSB output signals undergo additional processing, such as bitwise/logical/mathematical operations, signal conditioning/manipulation, combination with output signals from other FSBs, and the like.

For many FSBs, the silicon area taken up by the interconnection resources is significant. In fact, the interconnection resources may be comparable or even larger than the logic to implement the functionality of the FSB. It is therefore an object to increase the functionality of FSBs (and sub-blocks internal FSBs) without significantly increasing the cost in silicon area by more efficient use of interconnection resources.

SUMMARY OF THE INVENTION

The present invention relates to PLDs wherein dedicated routing interconnects are provided to facilitate the input of signals into a FSB (e.g., one or more sub-blocks internal to the FSB) while allowing interconnection resources to be conserved. Outputs from logic groupings that preferably neighbor a FSB are utilized to expand the functionality of the FSB.

DETAILED DESCRIPTION OF THE INVENTION

Figure 1A:
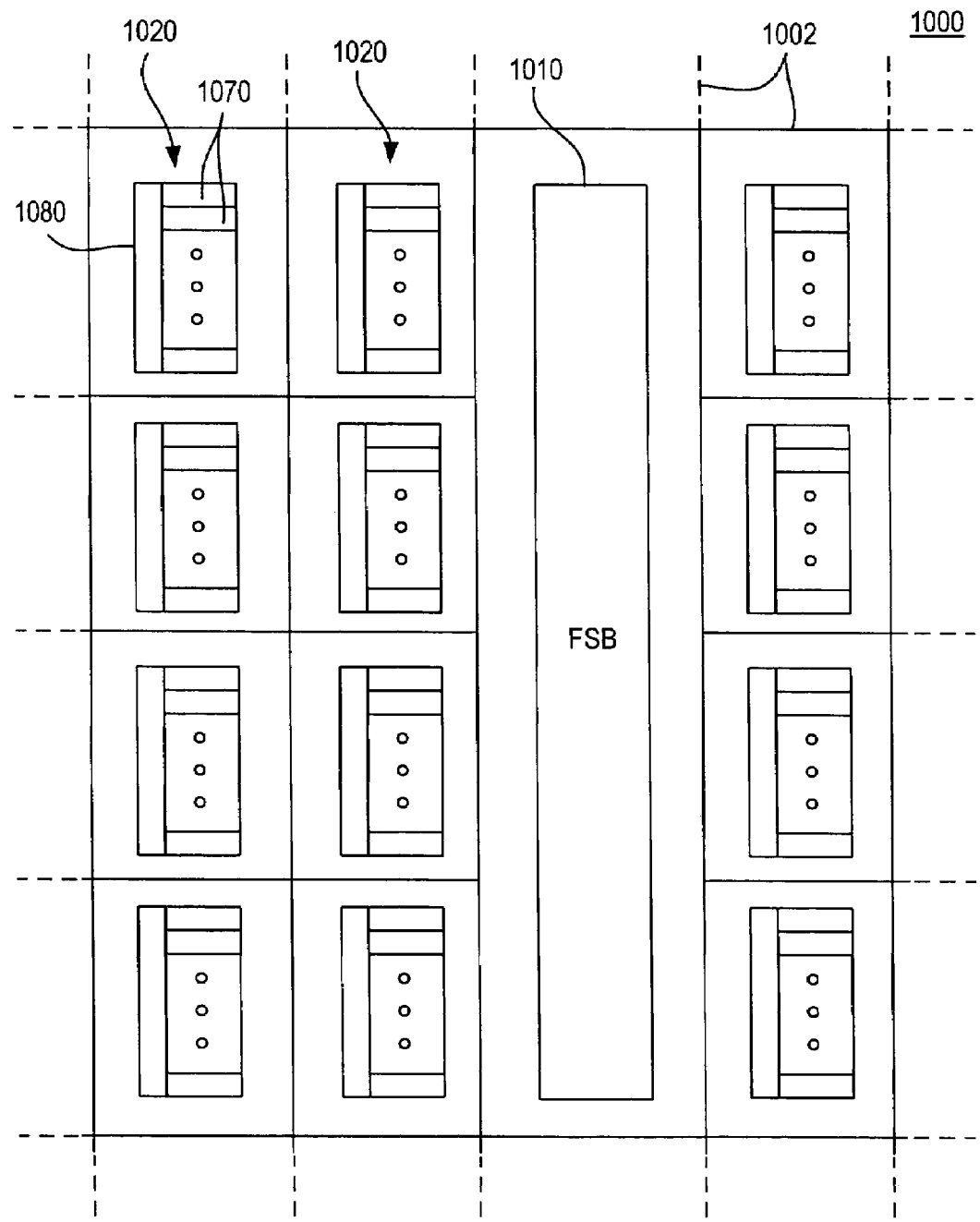
FIG. 1A is a simplified block diagram of a PLD.

FIG. 1A shows, in highly simplified form, a portion of a PLD 1000. PLD 1000 may include blocks of generic programmable logic resources 1020, which may be any of a variety of types of logic (e.g., product-term/sum-of-products, lookup-table, etc.). Each block of generic programmable logic resources 1020 may include several smaller regions of programmable logic 1070 and intra-block interconnection resources 1080 for conveying signals amongst such regions 1070.

In addition to the blocks of generic programmable logic resources 1020, PLD 1000 may also include a function specific block (FSB) 1010 such as a memory or a digital signal processing (DSP) block. Internal to FSB 1010 are preferably function sub-blocks 1030 (not shown in FIG. 1A; described in more detail in connection with FIG. 1B).

PLD 1000 may also include general interconnection resources 1002 for conveying signals throughout PLD 1000. These resources are often termed the routing fabric or the routing interconnect of the PLD or global field programmable gate array (FPGA) routing. In order to avoid over-complicating FIG. 1A, general interconnection resources 1002 are shown as single lines, each of which may be representative of an interconnection structure that may include multiple conductors of different types and lengths, as well as a variety of structures that are programmably selectively configurable for routing signals throughout PLD 1000, such as: global interconnection conductors that span entire rows and columns of blocks of generic programmable logic resources 1020; local/intermediate interconnection conductors that span a portion of a row or column; programmable switches that are configurable to selectively allow connections amongst the various global/intermediate/local interconnection conductors and the other structures on PLD 1000 (e.g., FSBs 1010, blocks of generic programmable logic resources 1020, sub-blocks 1030, input/output circuitry, etc.); and buffers/drivers, some of which may be tristatable, unidirectional, bidirectional, etc.

Despite the variety and flexibility of general interconnection resources 1002 for routing signals throughout PLD 1000, substantial interconnection resources may, in some cases, still be required to effectively accommodate the routing needs of FSBs 1010 in various processing operations (e.g., bitwise/logical/mathematical operations, signal conditioning/manipulation, combination with output signals from other FSBs, etc.). In some PLD designs, the routing needs of FSBs are met primarily by diverting or sharing existing routing resources associated with the structures surrounding the FSBs (e.g., blocks of generic programmable logic resources), and piecing together those routing resources as needed.

Figure 1B:
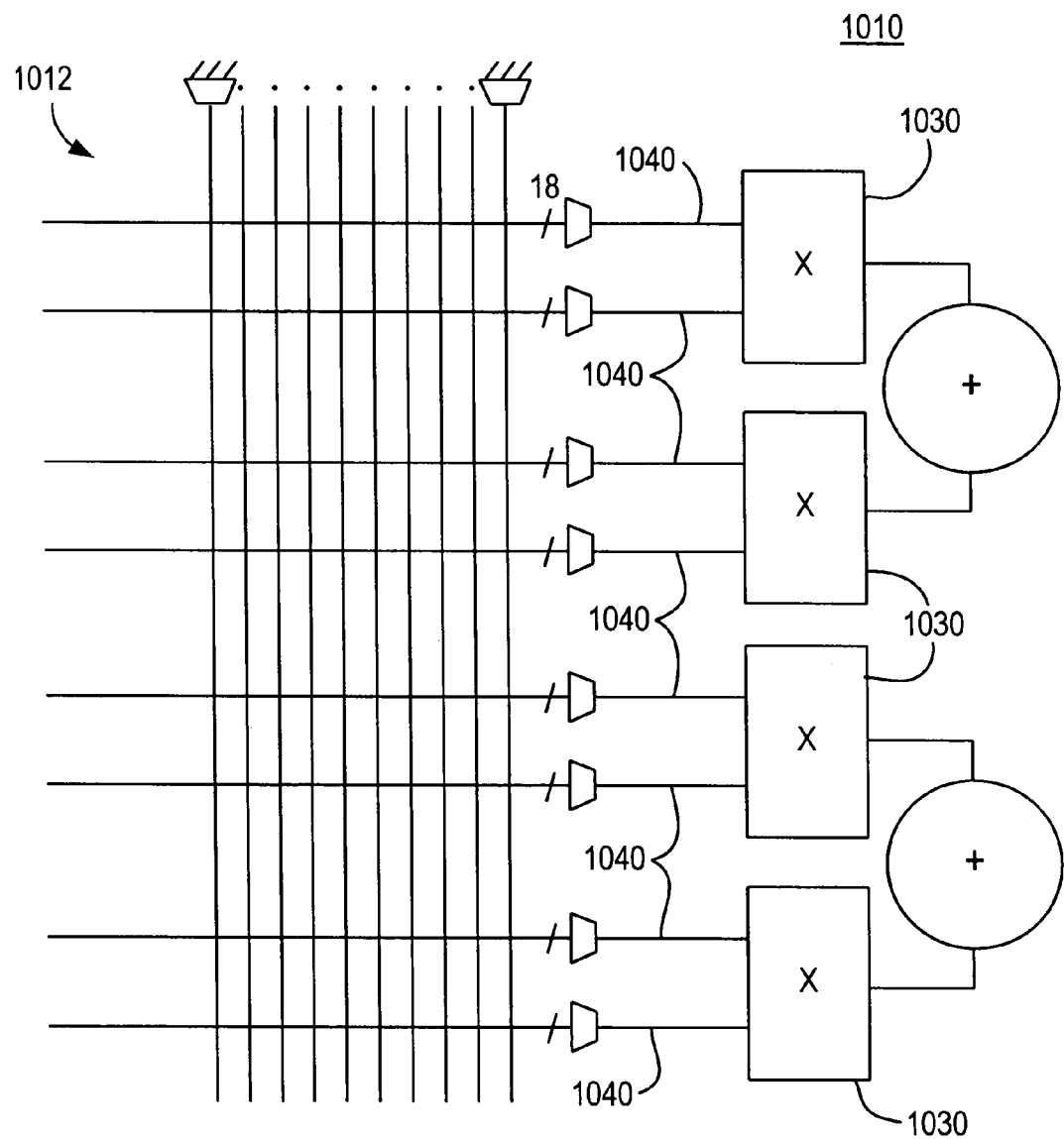
FIG. 1B is a simplified diagram of a FSB of a PLD and sub-blocks internal to the FSB.

FIG. 1B shows, in highly simplified form, a portion of FSB 1010. FSB 1010 includes interconnection resources 1012 for conveying signals from PLD 1000 (not shown in FIG. 1B) throughout FSB 1010 and to sub-blocks 1030 (shown here as multipliers) internal to FSB 1010.

Each FSB and its sub-blocks may be a concentration of circuitry that has been partly- or fully-hardwired to perform one or more specific operations (e.g., bitwise/logical/mathematical functions, combination/manipulation/conditioning of signals, etc.), and/or to implement one or more specialized structures (e.g., configurable memory elements, etc.). Examples of FSBs include: multipliers, ALUs, barrel-shifters, various memory elements (such as FIFO/LIFO/SIPO/RAM/ROM/CAM blocks and register files), AND/NAND/OR/NOR arrays, etc., or combinations thereof. An FSB and its sub-blocks may be designed to perform a single specialized operation or function (e.g., multiplication). Alternatively, an individual FSB may be designed to include multiple function-specific structures. For example, an FSB may contain two function-specific structures (e.g., implemented as two sub-blocks) such as a RAM block and a multiplier. For the purposes of the present invention, an FSB or a sub-block may be any grouping of partly- or fully-hardwired structures that are configured to perform one or more specialized functions.

As shown in FIG. 1B, FSB 1010 includes eight independent inputs 1040 to sub-blocks 1030 (which are shown here as multipliers). Each input 1040 is an eighteen-bit wide bus. Although clearly not limited to eighteen bits, the buses from which each input 1040 receives data are shown as having eighteen bits because this is a very common implementation of PLDs. With the shown available interconnection resources and eight independent inputs, FSB 1010 can complete four separate eighteen-by-eighteen multiplication operations.

Figure 2:
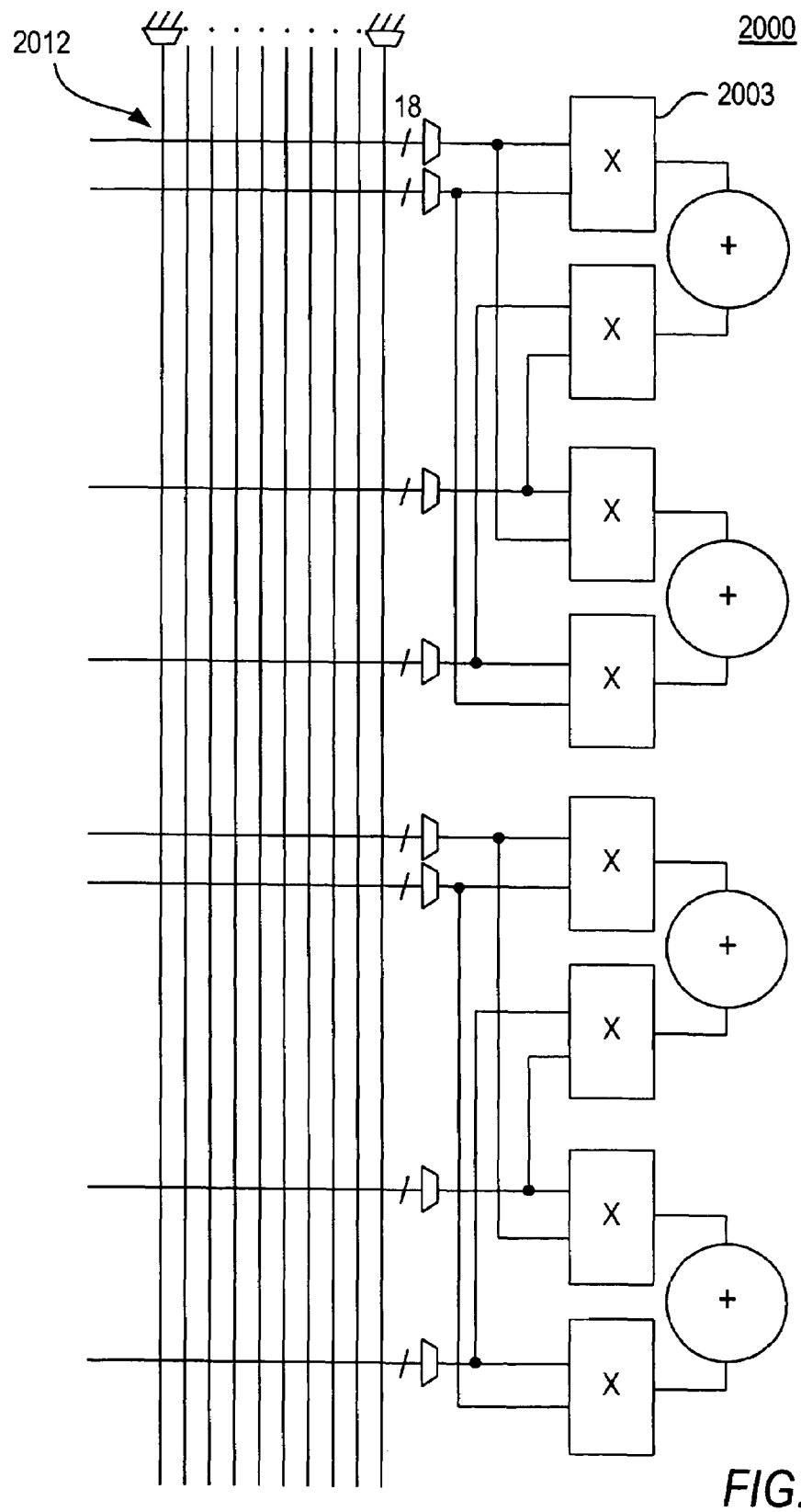
FIG. 2 is a simplified diagram of a FSB with sub-blocks that share inputs.

FIG. 2 illustrates a FSB 2000 configured to increase the functionality of the block without increasing the input and output resources. As shown in FIG. 2, there are four more (for a total of eight) eighteen-by-eighteen bit multipliers 2003 in FSB 2000 than in FSB 1010 of FIG. 1B. The additional four multipliers 2003 can be configured into FSB 2000 because of the input sharing from the horizontal bus lines of the interconnection resources 2012.

As shown, each multiplier 2003 shares an input with another multiplier. This adaptation of extra multipliers is described in detail in U.S. Provisional Patent Application No. 60/772,197 entitled "flexible Hardwired DSP Block For FPGA Devices" to Lee et al., filed Feb. 9, 2006. This application is incorporated herein by reference. By the addition of the multipliers (with some modifications to the internal structure of the FSB 2000), this allows a complex multiplication (e.g., (a+bi)(c+di)) to be performed in FSB 2000. This configuration also reduces the amount of FSB portions required for a thirty-six-by-thirty-six bit multiplier. However, this configuration cannot use the eight multipliers 2003 independently.

The present invention expands the functionality of FSB beyond that of the configuration of FSB 2000 by providing dedicated resource interconnects from logic groupings (e.g., generic programmable logic resources such as generic programmable logic resources 1080 of FIG. 1A) to the FSB. These logic groupings are preferably external to the FSB but may alternatively be from inside a portion of the FSB (e.g., from an internal sub-block that can output to another portion of the FSB).

A logic grouping may have the ability to perform arithmetic (such as addition) as part of its configuration. Alternatively, the logic grouping could be a dedicated functional block or dedicated logic within the block such as a look-up table (LUT). A LUT could have registered (through a flip-flop) and unregistered (direct output of a LUT) outputs. The output of a logic grouping should not be construed to be restricted to LUT outputs. The outputs of a logic grouping may also be the output of a D-type flip-flop (DFF) or register, combinational (LUT) and arithmetic (sum-out) outputs of a logic element and collectively of a logic grouping.

Figure 3A:
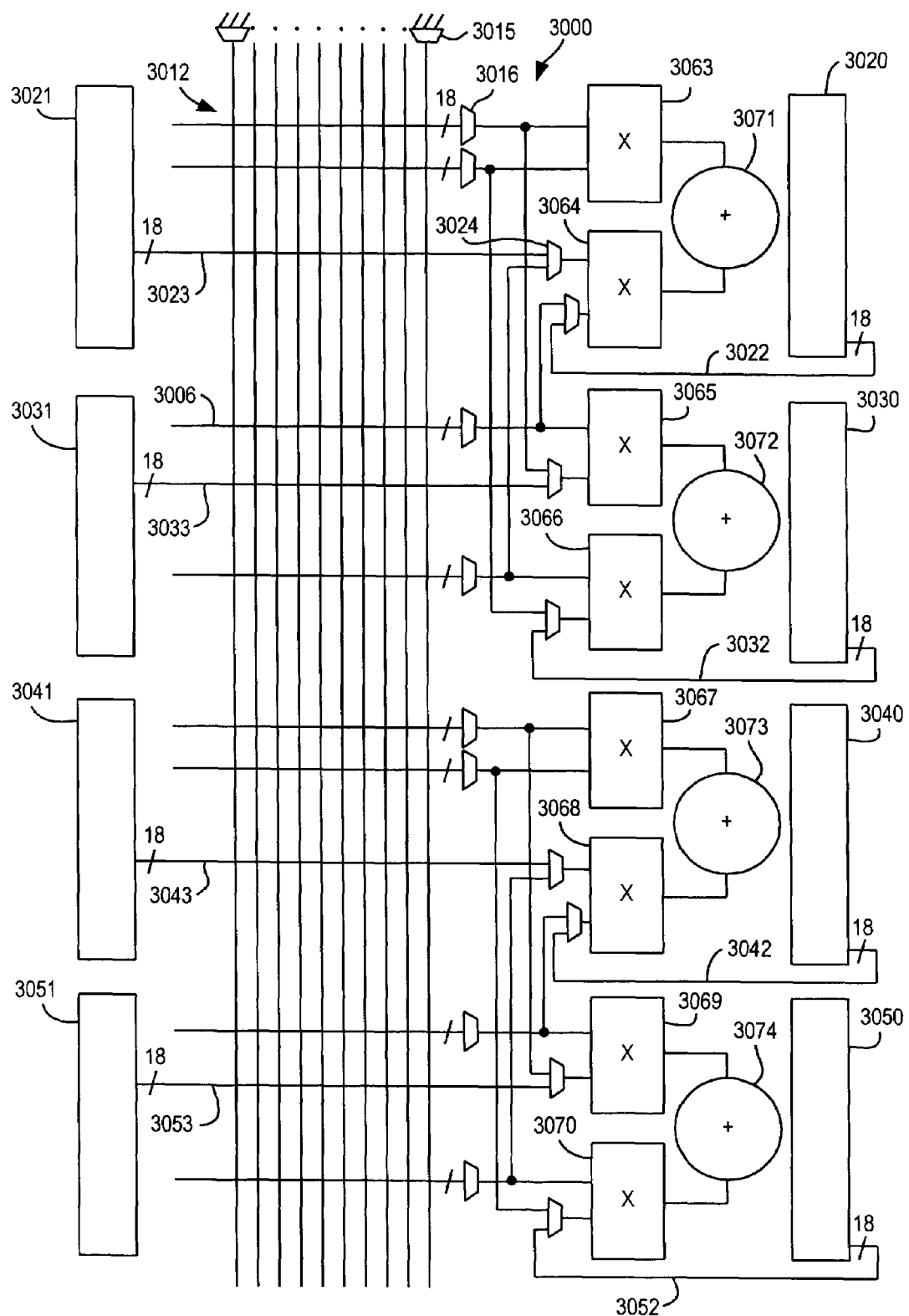
FIG. 3A is a simplified FSB with dedicated routing interconnects from logic groupings that may be constructed in accordance with the present invention.

FIG. 3A illustrates an exemplary FSB 3000 (which may be a DSP block) with dedicated routing interconnects in accordance with the present invention. As shown in FIG. 3, FSB 3000 is adjacent to logic groupings 3020, 3021, 3030, 3031, 3040, 3041, 3050, and 3051. Logic groupings 3020, 3021, 3030, 3031, 3040, 3041, 3050, and 3051 may be, for example, logic array blocks (LABs), configurable logic blocks (CLBs), look-up tables (LUTs), adaptive logic modules (ALMs), or a contiguous region of otherwise unrelated generic logic. Although not termed or considered a logic block or any of the other aforementioned groupings, logic groupings 3020, 3021, 3030, 3031, 3040, 3041, 3050, and 3051 may nonetheless be considered as such because of their function, proximity to other groupings around them, or their relative size to other groupings around them. Such consideration is not necessarily related to the collection of logic elements as a group. Rather, the logic elements may be unrelated.

FSB 3000 of FIG. 3A is similar to FSB 2000 of FIG. 2. FSB 3000 may include interconnection resources 3012, multipliers 3063, 3064, 3065, 3066, 3067, 3068, 3069, and 3070 as well as add units (e.g., add units 3071, 3072, 3073, 3074). This is merely exemplary. FSB 3000 may be programmed or otherwise sub-blocks such as dedicated multipliers, multiplier-accumulators, adders, memory blocks, crossbars, barrel shifters, and microprocessors. The buses in interconnection resources 3012 are shown as eighteen bits wide. This is merely exemplary. In practical applications the buses may be any suitable width.

As is the case with FSB 2000, the inputs to the sub-blocks (e.g., multipliers 3063, 3064, 3065, 3066) are controlled by multiplexers. For example, multiplexers 3015 drive the vertical bus lines while multiplexers 3016 drive the horizontal bus lines of interconnection resources 3012. Multiplexers 3015 and 3016 are controlled by, for example, SRAM configuration bits, or FLASH or $E^2$ (EEPROM) cells (not shown). As is also the case with FSB 2000, the sub-blocks of FSB 3000 also share inputs. For example, multiplier 3063 may share an input with multiplier 3065 as well as share an input with multiplier 3066.

In addition to sharing inputs, the sub-blocks (or, more generally, FSB 3000) have one or more dedicated inputs from another source. This source may be from, for example, logic groupings 3020, 3021, 3030, 3031, 3040, 3041, 3050, or 3051. These sources are merely exemplary. An FSB may receive dedicated inputs from any suitable source. Such a suitable source is preferably a logic grouping that is preferably in physical proximity to the FSB. The input into an FSB or into a sub-block is preferably a dedicated routing interconnect. This routing interconnect is dedicated in that it is not programmable. The dedicated routing interconnect may be referred to as a "sneak path" or "dedicated path."

In the embodiment shown in FIG. 3A, multipliers 3064, 3066, 3068, and 3070 receive inputs from dedicated routing interconnects. As shown, multiplier 3004 may receive two inputs from dedicated routing interconnects 3022 and 3023. The source of these routing interconnects in this exemplary embodiment are logic grouping 3020 and 3021, respectively. In other embodiments, sub-blocks or other portions of a FSB may receive more than one dedicated routing interconnect from the same logic group, some other source such as a random access memory (RAM), a logic group configured as a RAM, or some combination of the same. Examples of these alternative embodiments are discussed in FIGS. 3B and 4.

In addition to multiplier 3064 receiving interconnects 3022 and 3023, multiplier 3066 receives inputs from dedicated routing interconnects 3032 and 3033; multiplier 3068 receives inputs from dedicated routing interconnects 3042 and 3043; and multiplier 3070 receives inputs from dedicated routing interconnects 3052 and 3053.

As shown in FIG. 3, each dedicated routing interconnect (e.g., 3022, 3023, 3032, 3033, etc.) is multiplexed with a signal source from interconnection resources 3012. For example, the signal supplied from dedicated routing interconnect 3022 is multiplexed by 2:1 multiplexer 3024 with signal 3006 from interconnection resources 3012. Generally, a multiplexer may receive an input from the general interconnection resources and an input from a dedicated routing interconnect and supply the multiplexed output to a FSB.

Alternatively, a dedicated routing interconnect may be supplied directly to a FSB. The addition of multiplexers for multiplexing an input from the interconnection resources and an input from a logic grouping is dependent, in part, on the amount of inputs to the FSB. In those circumstances when a FSB has ample inputs to receive a dedicated routing interconnect directly, the multiplexer may be unnecessary. Further alternative combinations permitting the interleaving of partial input words (e.g., buses) are possible.

The addition of the dedicated routing interconnects of FSB 3000 provide for sixteen total independent inputs into the FSB. Prior to the addition of the dedicated routing inputs, there were only eight independent inputs. Therefore, because of these eight additional independent inputs, the FSB advantageously can provide additional functionality. This additional functionality is obtained without costly additions to input circuitry from the interconnection resources. For example, with sixteen independent inputs, a FSB may compute eight independent multiply operations instead of four independent multiply operations with eight independent inputs.

As illustrated, the buses of FSB 3000 are eighteen bits wide. Typically, when the buses of a FSB are a particular width the sub-blocks of that FSB are capable of receiving that amount of bits. Therefore, in the embodiment shown in FIG. 3, dedicated routing interconnects 3022, 3023, 3032, 3033, etc. are preferably also eighteen bits wide. This means that logic groupings 3020, 3021, 3030, 3031, etc. preferably have at least eighteen outputs. In those embodiments in which a logic grouping has more outputs than the number of bits on the bus, those additional outputs may be used as, for example, generic logic outputs of the logic grouping. However, when there are more than double or triple (or any integer amount more than) the amount of outputs of the logic grouping than there are bits on the bus of a FSB, the logic grouping may use these outputs to provide an additional dedicated routing interconnect. For example, if the bus of a FSB were eighteen bits wide and the logic grouping had forty outputs, the logic grouping could provide two dedicated routing interconnects each eighteen bits wide. The remaining four outputs of the logic grouping (i.e., forty outputs minus two times eighteen-bit wide dedicated routing interconnect buses) can be used as general purpose logic outputs of the logic grouping.

Figure 3B:
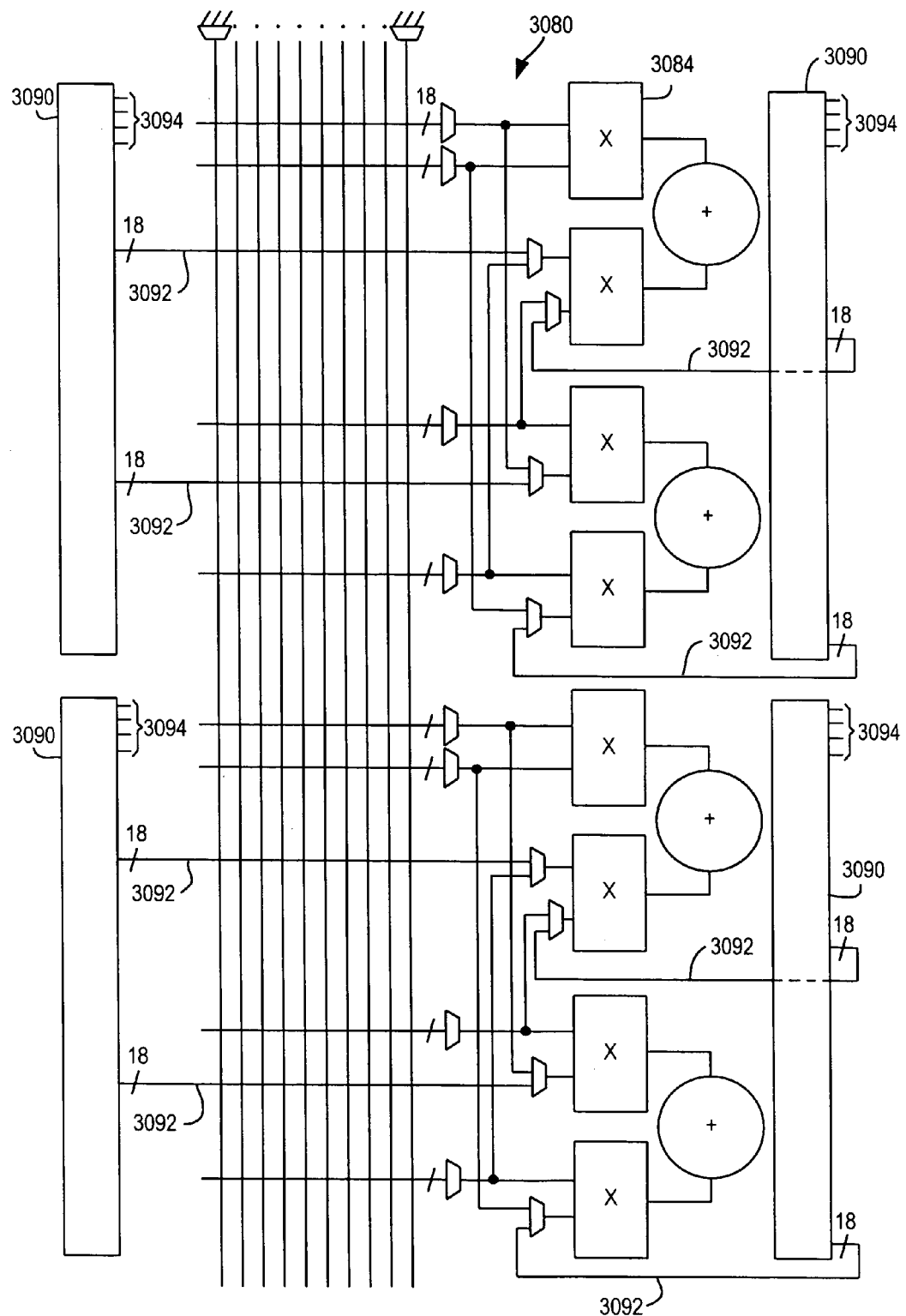
FIG. 3B is a simplified FSB with dedicated routing interconnects from logic groupings that may be constructed in accordance with the present invention.

Such an embodiment is shown in FIG. 3B. As shown, logic groupings 3090 have forty outputs. The buses of FSB 3080 (which may be a DSP block) of FIG. 3B are eighteen bits wide. Each logic grouping can therefore supply two eighteen-bit wide dedicated routing interconnects into FSB 3080. These routing interconnects, 3092, are supplied to sub-blocks 3084 of FSB 3080. As shown, the dedicated routing interconnects of logic groupings 3090 may supply different sub-blocks 3084. The remaining four outputs (outputs 3094) of logic groupings 3090 may be used as general logic outputs.

Although the FSBs in FIGS. 3A and 3B are illustrated with multiple dedicated routing interconnects, this is merely exemplary. It is possible that a FSB, sub-block, or logic region can have a single dedicated routing interconnect as one of its inputs. It is further possible that no interconnection resources 3012 are provided and that all inputs to a FSB are provided by dedicated resource interconnects.

Figure 4:
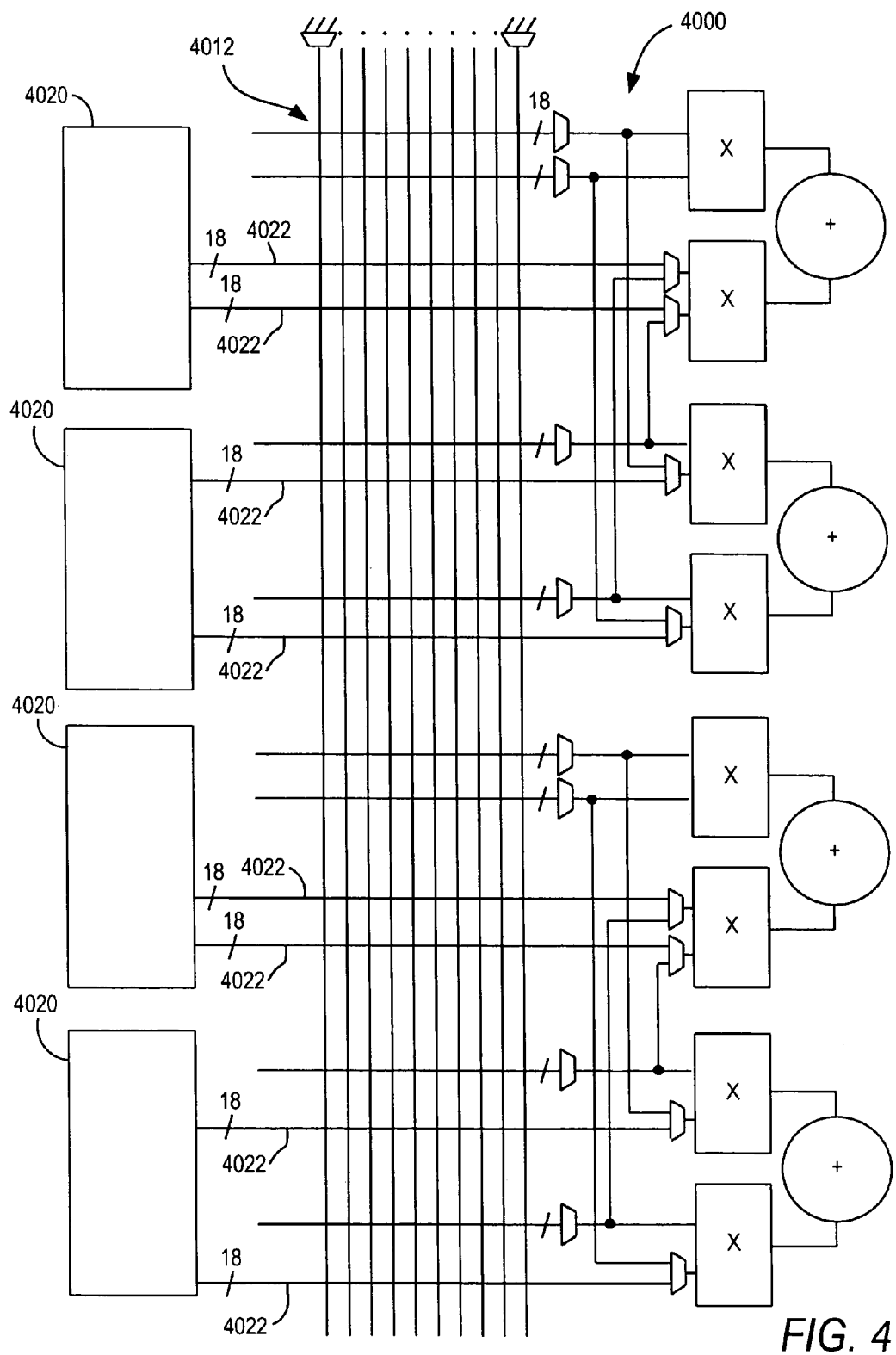
FIG. 4 is a simplified FSB with dedicated routing interconnects from RAMs that may be constructed in accordance with the present invention.

FIG. 4 shows an alternative source for dedicated routing interconnects to the logic groupings of FIG. 4. Instead of a logic grouping, the source for dedicated routing interconnects is another FSB implementing a memory block. Exemplary memory block 4020 is an 8 k-bit random access memory block that has thirty-six outputs. These thirty-six outputs, in the embodiment shown in FIG. 4 which has an eighteen-bit wide FSB 4000 (which can be a DSP block), can be set up as two eighteen-bit wide dedicated routing interconnects. As shown, dedicated routing interconnects 4022 may be supplied to FSB 4000 as independent inputs. As is the case with FSB 3000, these independent inputs may be multiplexed with general inputs into DSP block 4000 from interconnection resources 4012.

Although described above as a dedicated memory block such as a RAM, memory block 4020 may be, for example, generic logic programmed as a memory or a shift-register block. For example, as described in U.S. patent application Ser. No. 11/320,253 entitled "Distributed Memory In Field-Programmable Gate Array Integrated Circuit Devices" to Lewis et al., filed Dec. 27, 2005, and U.S. patent application Ser. No. 10/897,743 entitled "Distributed Random Access Memory In A Programmable Logic Device" to Lewis et al., filed Jul. 22, 2004 (both applications are incorporated herein by reference), logic groupings of general purpose logic may be configured as, for example, a 32*32 RAM with twenty outputs. The outputs of such configured RAMs may be used as, a bus of a dedicated routing interconnect.

Another alternative source of dedicated routing interconnects can be a dedicated functional block. Such a functional block may be a sub-block in which the FSB that receives the input from the dedicated routing interconnect is physically located. Alternatively, the dedicated functional block may be outside the FSB and perhaps not even in physical proximity to the FSB. Examples of such dedicated functional blocks that may be a signal source for dedicated routing interconnects are a switching block (e.g., a crossbar or a barrel shifter), a bus output from a dedicated processor, a dedicated block such as an Ethernet MAC switch, a collection of inputs driven by pins on an integrated circuit chip on which the DSP block may be located, or the deserialized output of a transceiver.

Figure 5:
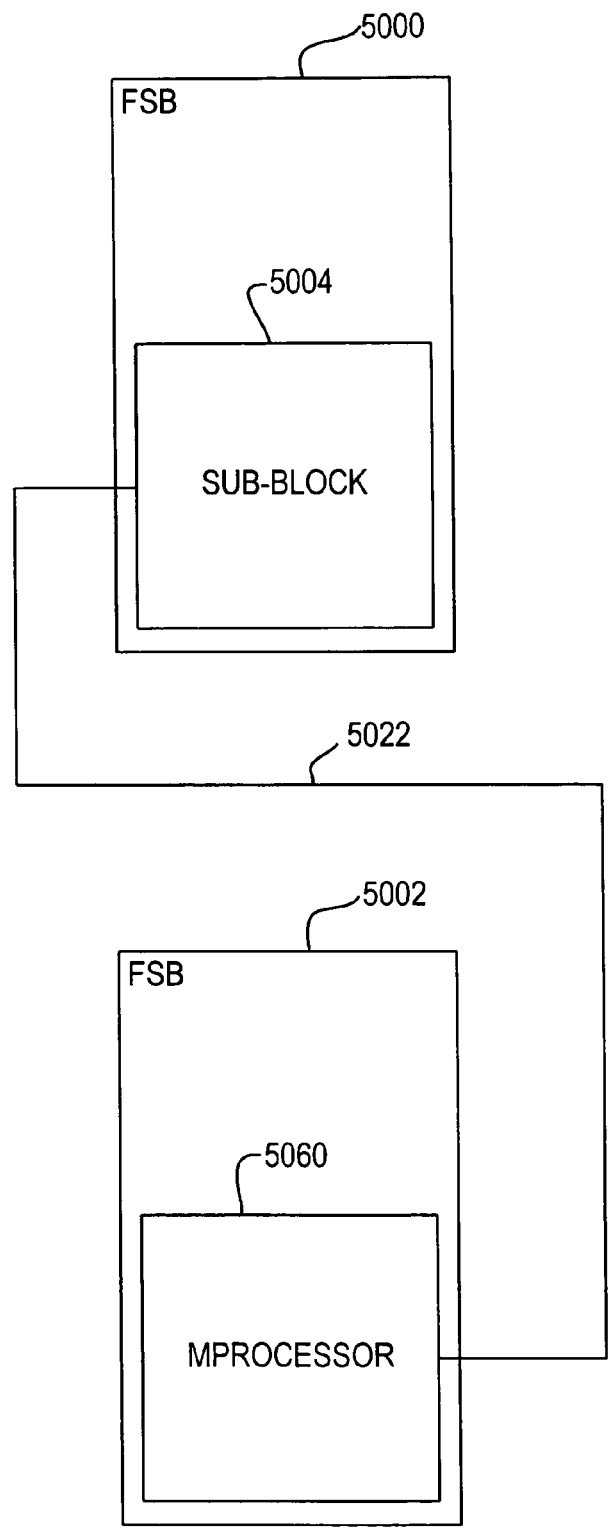
FIG. 5 is a simplified FSB with a dedicated routing interconnect from a sub-block to another sub-block of a separate FSB that may be constructed in accordance with the present invention.

For example, FIG. 5 shows two FSB 5000 and 5002 (which may be DSP blocks). FSB 5002 includes a dedicated microprocessor 5060. The output of microprocessor 5060 may be supplied via dedicated routing interconnect 5022 into sub-block 5004 of FSB 5000.

In each of the embodiments described above in connection with FIGS. 3A, 3B, 4, and 5, a FSB (or sub-block) receives a dedicated routing interconnect. The principles of the present invention are not intended to be so limited. Rather, dedicated routing interconnects may be received by any suitable destination. For example, instead of a FSB, a dedicated routing interconnect may be supplied to a RAM, a switching block, or a dedicated serialization block associated with a transceiver.

In the case of RAMs, programmable logic devices often allow RAMs to be used in different width and depth modes. For example, an 8 k memory (with 8*1024 bits of storage) can be used as either an 8K by 1 memory (one bit of data width, thirteen bits of address to generate 8K depth) or as a 256 by 32 memory (32 bits of data width, 256 bits of data depth and 16 bits of address required). The use of dedicated routing interconnects allows for a broader range of programmability for RAMs. Without the use of dedicated routing interconnects, the cost in terms of silicon area of supporting wide modes is potentially prohibitive. For example, a seventy-two bit wide RAM might be uncommonly used because of cost but nonetheless still desirable. With cheaper dedicated resources such a memory can be supported without the prohibitive cost.

As was previously mentioned, with the addition of dedicated routing interconnects, FSB 3000 can perform eight eighteen-bit by eighteen-bit multiplication operations (assuming an eighteen-bit bus) instead of the previous four operations. This is shown in FIG. 3A. With some additional reconfiguration, the dedicated routing interconnects can be used to provide for more yet smaller bit-size multiplication operations. This is shown in FIG. 6.

Figure 6:
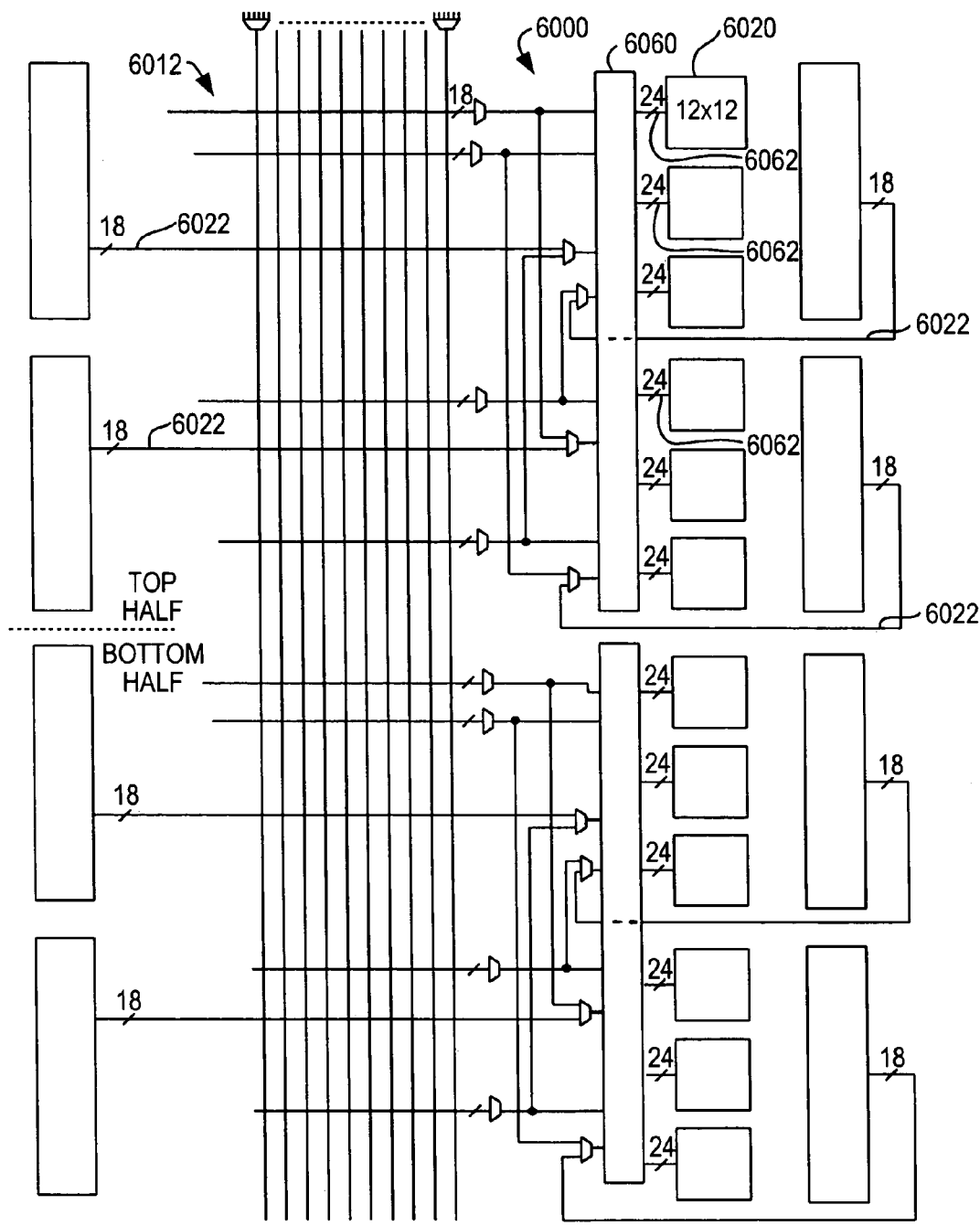
FIG. 6 is a simplified FSB with an input structure and dedicated routing interconnects from logic groupings that may be constructed in accordance with the present invention.

FIG. 6 shows, in the top half of FSB 6000 (which may be a DSP block), six twelve-by-twelve multipliers 6020. Prior to the addition of the dedicated routing interconnects, the top half of FSB 6000 could only support four eighteen-by-eighteen bit multipliers. Such a limitation is imposed because of the four eighteen-bit wide bus lines used as inputs. Because of the additional four eighteen-bit wide bus lines supplied from the dedicated routing interconnects, the top half of FSB 6000 receives 144 bits as inputs in the form of eight eighteen-bit wide buses (four from interconnection resources 6012 and four from dedicated routing interconnects). Instead of configuring the top half of FSB 6000 to perform four eighteen-by-eighteen bit multipliers, FSB 6000 may be configured to perform six twelve-by-twelve bit multiply operations.

As shown in FIG. 6, dedicated routing interconnects 6022 are not driven directly into multipliers 6020. Routing interconnects 6022 are driven instead into input selection structure 6060 associated with FSB 6000. In one embodiment, input selection structure 6060 is a multiplexer or a group of multiplexers; e.g., as a full crossbar. In another embodiment, input selection structure 6060 may be a partially populated crossbar. A partially populated crossbar may cost less than a full crossbar in terms of silicon area but may have less flexibility than a full crossbar. (It should be noted that input selection structure 6060 may cost silicon area; however, such area is negligibly expensive in comparison to the addition of multiplexers into interconnection resources 6012 to achieve the same functionality.)

Input selection structure 6060 has six outputs—one for each of the six twelve-by-twelve multipliers. Each output 6062 is twenty-four bits wide and is input into a multiplier 6020. Each of these twenty-four-bit wide outputs supports the twelve-by-twelve bit multiply operation in the respective multiplier 6020. This configuration results in six independent twelve-by-twelve multipliers in the top half of FSB 6000. The determination of the multiply operation of each multiplier 6020 may be used independently of the other multipliers 6020.

Although this re-configuration of FSB 6000 is described in connection with the top half of FSB 6000, the bottom half of FSB 6000 may be similarly configured. Alternatively, the bottom half of FSB 6000 may be configured in some other preferable arrangement (e.g., as eighteen-by-eighteen bit multipliers). More generally, FSB 6000 as well as the other FSB described herein may be configured as desired. Such configuration may be assisted by the use of configuring a portion of a FSB as an input selection structure as is the case in FSB 6000 of FIG. 6.

In many applications, logic groupings such as the aforementioned logic groupings (e.g., 3020, 3021, 4020, etc.) may include output logic. For example, this output logic may be a multiplexer that drives horizontal and vertical drivers for connection to general interconnection resources of a PLD. However, when a logic grouping is used as a signal source for a dedicated routing interconnect, this may often mean that the output logic of the logic grouping is not being utilized.

Figure 7:
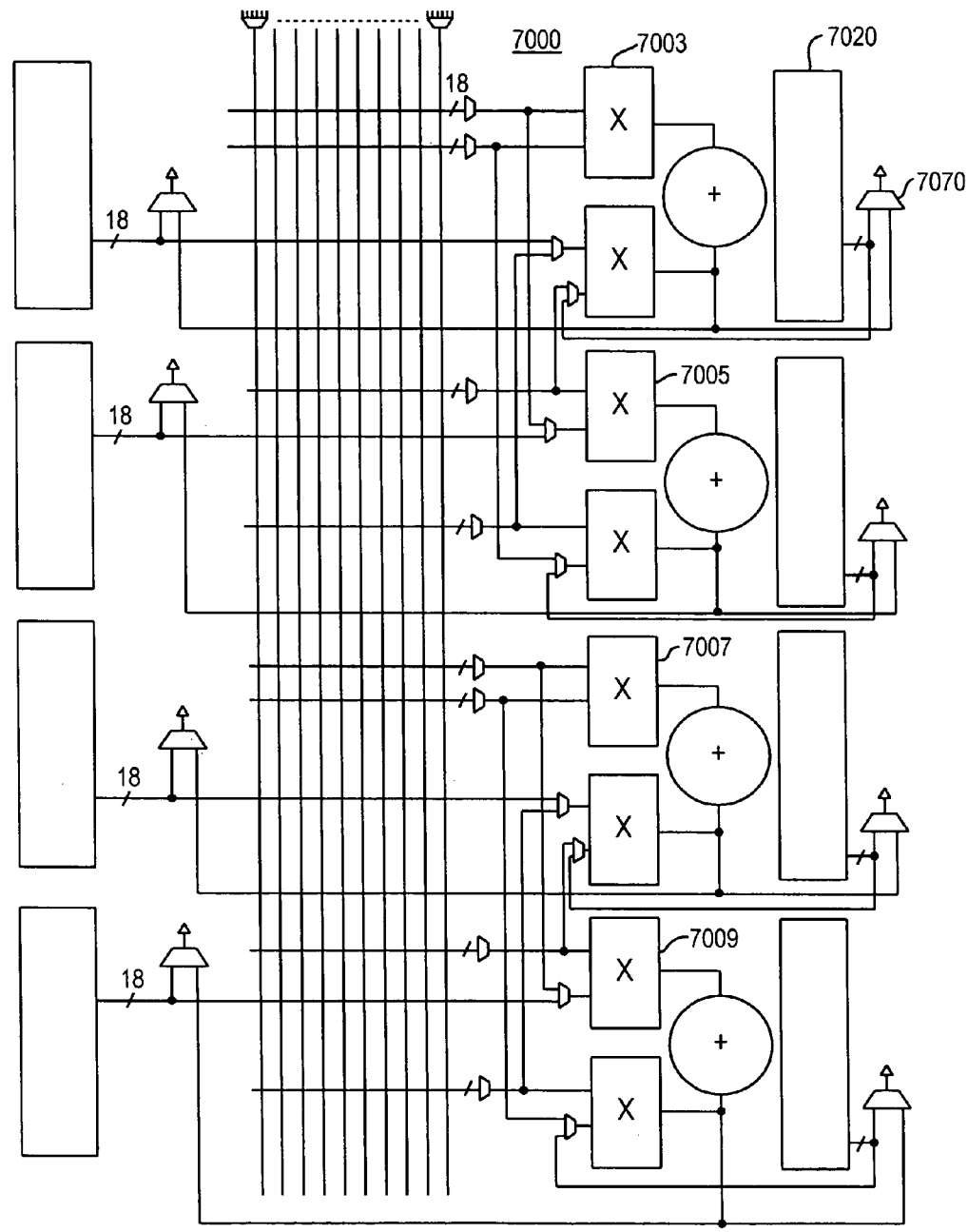
FIG. 7 illustrates dedicated routing interconnects from logic groupings and output logic of the logic groupings to provide independent outputs to sub-blocks of FSBs that may be constructed in accordance with the present invention.

In those circumstances that the output logic of a logic grouping is not being utilized, the present invention can take advantage of such a circumstance by using that logic to, for example, make the output of a FSB or a sub-block independent. This may be done by routing the output of a FSB or a sub-block to the output logic of the logic group. FIG. 7 illustrates that logic groupings 7020 are not using a portion of their output logic. This portion is shown as multiplexer 7070. Although multiplexers 7070 are associated with their respective logic grouping 7020 (e.g., may be internal to a logic grouping 720), multiplexers 7070 are shown outside of logic groupings 7020 for ease of illustration. Multiplexers 7070 may receive at its inputs the signal applied to a dedicated routing interconnect and the output of a FSB or a sub-block.

The output of the sub-block that multiplexer 7070 receives as its input is preferably the output of a sub-block that would not otherwise be able to supply an independent output. The output of the sub-block may be supplied to the output logic of one or more logic grouping. Such sub-blocks that would not otherwise be able to supply an independent output are those sub-blocks that, for example, are not coupled to output connection resources (now shown in the figures). Those sub-blocks are typically those that are added to (or reconfigured into) a FSB by way of the addition of dedicated routing interconnects (e.g., blocks 3064, 3066, 3068, 3070).

By using the output logic of the logic groupings in this way, the outputs of each sub-block may be able to be provided to other destinations independently of one another. Without the utilization of the output logic of the logic grouping as shown in FIG. 7, the outputs of only sub-blocks 7003, 7005, 7007, and 7009 (of FSB 7000) could be used independently. This is because the outputs of only these sub-blocks could be provided directly to an output driver (not shown) of the FSB.

Figure 8:
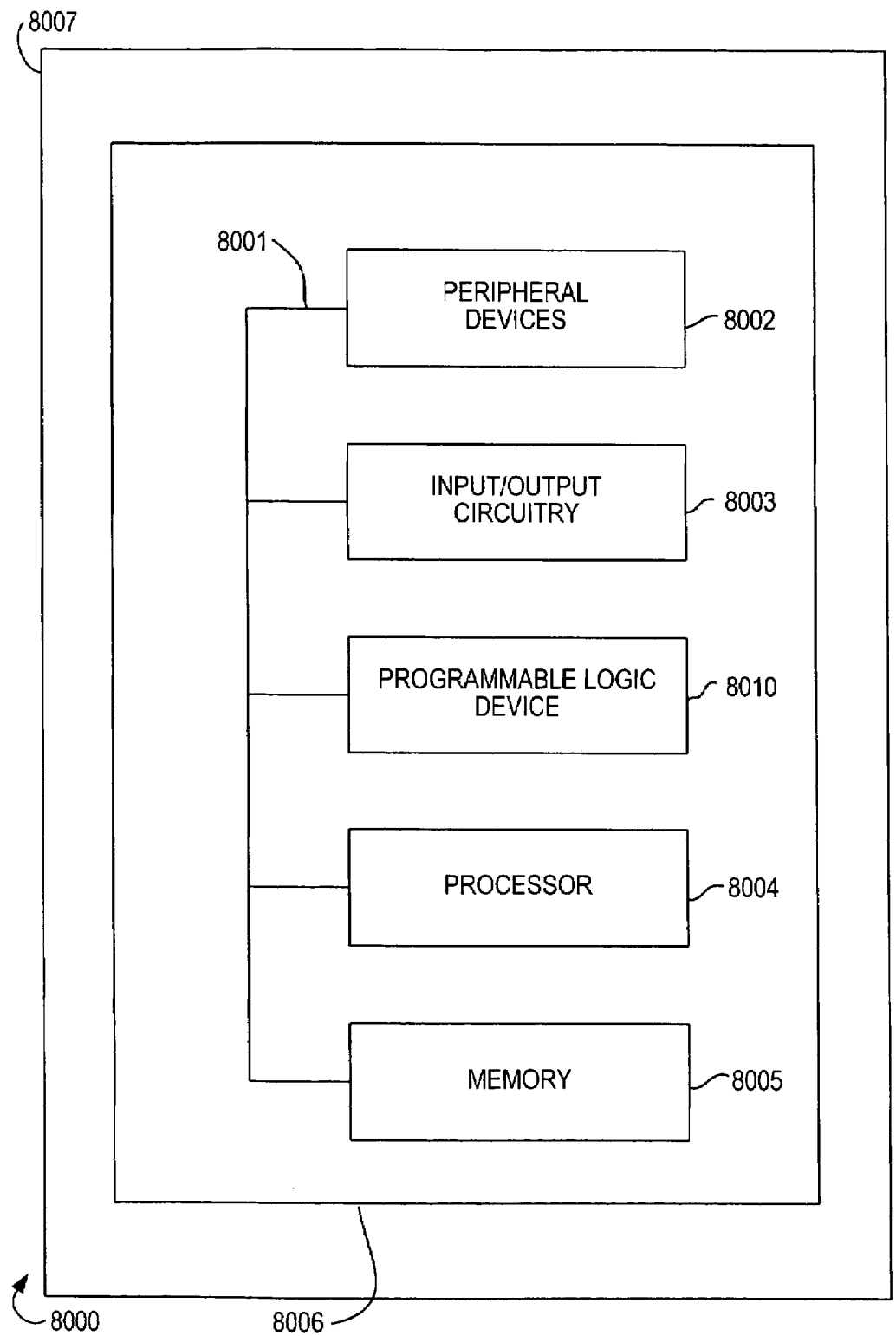
FIG. 8 is a simplified block diagram of an illustrative system employing a PLD that has been improved in accordance with the principles of the present invention.

FIG. 8 shows how PLDs constructed in accordance with the present invention (e.g., PLD 8010 that may include a FSB such as blocks 3000, 3080, 4000, 5000, 5002, 6000, or 7000 which may be DSP blocks), that includes the above-described dedicated routing interconnect, may be used in a data processing system 8000. Data processing system 8000 may include one or more of the following components: peripheral devices 8002, input/output circuitry 8003, a processor 8004; and a memory 8005. These components may be coupled together by a system bus 8001 and may be populated on a printed circuit board 8006, which may be contained in an end-user system 8007.

System 8000 may be used in a wide variety of applications, such as computer networking, data networking, instrumentation, video processing, digital signal processing, or any other application where the advantage of using programmable or reprogrammable logic is desirable. PLD 8010 can be used to perform a variety of different logic functions. For example, PLD 8010 can be configured as a processor or controller that works in cooperation with processor 8004. PLD 8010 may also be used as an arbiter for arbitrating access to a shared resource in system 8000. In yet another example, PLD 8010 can be configured as an interface between processor 8004 and one of the other components in system 8000. It should be noted that system 8000 is only exemplary, and that the true scope and spirit of the invention should be indicated by the following claims.

Various technologies can be used to implement PLD 8010 employing the above-described dedicated routing interconnects in accordance with this invention, as well as the various components included therein. For example, programmable logic connectors (PLC) may connect any one of several inputs to an output. Each PLC can be a relatively simple programmable connectors such as a switch or a plurality of switches for connecting the inputs to outputs. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc.

The various components of PLCs can be controlled by various programmable, function control elements (FCEs). (With certain PLC implementations (e.g., fuses and metal optional links) separate FCE devices are not required.) FCEs can be implemented in any of several different ways. For example, FCEs can be SRAMs, DRAMs, first-in first-out (FIFO) memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement.

Thus it is seen that PLDs with dedicated resource interconnections have been provided. One skilled in the art will appreciated that the present invention can be practiced by other than the described embodiments, which are presented for purposes of illustration and not of limitation, and the present invention is limited only by the claims that follow.

What is claimed is:

1. A programmable logic device comprising:
    a plurality of blocks of generic programmable logic resources;
    a function specific block;
    a network of general interconnection resources for conveying signals between the blocks of generic programmable logic and the function specific block; and
    input multiplexer circuitry associated with the function specific block, the multiplexer circuitry being controllable to select as input signals to the function specific block either (a) signals from the network or (b) signals from one of the blocks of generic programmable logic that are coupled to the multiplexer circuitry via a dedicated resource interconnection that does not use the network.

2. The programmable logic device of claim 1 wherein the function specific block comprises a DSP block.

3. The programmable logic device of claim 1 wherein the plurality of blocks of generic programmable logic resources comprise logic groupings with LUT-RAM capability.

4. The programmable logic device of claim 1 further comprising:
    a logic grouping with shift-register capability;
    a second function specific block; and
    second input multiplexer circuitry associated with the second function specific block, the second multiplexer circuitry being controllable to select as input signals to the second function specific block either (a) signals from the network or (b) signals from the logic grouping with shift register capability that are coupled to the second multiplexer circuitry via a second dedicated resource interconnection that does not use the network.

5. The programmable logic device of claim 1 further comprising:
    a RAM;
    a second function specific block; and
    second input multiplexer circuitry associated with the second function specific block, the second multiplexer circuitry being controllable to select as input signals to the second function specific block either (a) signals from the network or (b) signals from the RAM that are coupled to the second multiplexer circuitry via a second dedicated resource interconnection that does not use the network.

6. The programmable logic device of claim 1 further comprising:
    a switching block;
    a second function specific block; and
    second input multiplexer circuitry associated with the second function specific block, the second multiplexer circuitry being controllable to select as input signals to the second function specific block either (a) signals from the network or (b) signals from the switching block that are coupled to the second multiplexer via a second dedicated resource interconnection that does not use the network.

7. The programmable logic device of claim 1 wherein the multiplexer circuitry is programmed to select between the signals from the network and the signals from the one of the blocks of generic programmable logic.

8. The programmable logic device of claim 1 wherein the multiplexer circuitry is part of an input switching area associated with the function specific block.

9. The programmable logic device of claim 1 wherein the function specific block comprises a RAM.

10. The programmable logic device of claim 9 further comprising:
- a switching block;
- a second RAM; and
- second input multiplexer circuitry associated with the second RAM, the second multiplexer circuitry being controllable to select as input signals to the second RAM either (a) signals from the network or (b) signals from the switching block that are coupled to the second RAM via a second dedicated resource interconnection that does not use the network.

11. The programmable logic device of claim 1 wherein the function specific block comprises a switching block.

12. The programmable logic device of claim 11 wherein the plurality of blocks of generic programmable logic resources comprise logic groupings with LUT-RAM capability.

13. The programmable logic device of claim 11 further comprising:
- a second switching block;
- a grouping with shift-register capability; and
- second input multiplexer circuitry associated with the second switching block, the second multiplexer circuitry being controllable to select as input signals to the second switching block either (a) signals from the network or (b) signals from the grouping with shift-register capability that are coupled to the second multiplexer circuitry via a second dedicated resource interconnection that does not use the network.

14. The programmable logic device of claim 11 further comprising:
- a second switching block;
- a RAM; and
- second input multiplexer circuitry associated with the second switching block, the second multiplexer circuitry being controllable to select as input signals to the second switching block either (a) signals from the network or (b) signals from the RAM that are coupled to the second multiplexer circuitry via a second dedicated resource interconnection that does not use the network.

15. The programmable logic device of claim 1 wherein the function specific block includes at least one output that can be coupled via a second dedicated resource interconnection to an output logic resource of one of the blocks of generic programmable logic resources.

16. The programmable logic device of claim 1 wherein:
- each of the blocks of generic programmable logic resources comprises output logic; and
- the output logic is used to supply output signals of the blocks of generic programmable logic resources to the network of general interconnection resources of the programmable logic device.

17. A programmable logic device comprising:
- a plurality of blocks of generic programmable logic resources;
- a digital signal processing block;
- a network of general interconnection resources for conveying signals between the blocks of generic programmable logic resources and the digital signal processing block; and
- input multiplexer circuitry associated with the digital signal processing block, the multiplexer circuitry being controllable to select as input signals to the digital signal processing block either (a) signals from the network or (b) signals from one of the blocks of generic programmable logic resources that are conveyed to the multiplexer circuitry directly via dedicated signal routing that does not use the network.

18. The programmable logic device of claim 17 wherein each of the blocks of generic programmable logic resources is a logic grouping with LUT-RAM capability.

19. The programmable logic device of claim 17 wherein the input multiplexer circuitry is part of an input switching area that is intermediate the dedicated signal routing and the digital signal processing block.

20. The programmable logic device of claim 17 wherein the input multiplexer circuitry is part of an input switching area that is internal to the digital signal processing block and the dedicated signal routing supplies the signals from the one of the blocks of generic programmable logic resources to the input switching area internal to the digital signal processing block.

21. A programmable logic device comprising:
- a plurality of blocks of generic programmable logic resources;
- a block with shift register capability;
- a digital signal processing block;
- a network of general interconnection resources for conveying signals between the blocks of generic programmable logic resources, the block with shift register capability, and the digital signal processing block; and
- input multiplexer circuitry associated with the digital signal processing block, the multiplexer circuitry being controllable to select as input signals to the digital signal processing block either (a) signals from the network or (b) signals from the block with shift register capability that are conveyed to the multiplexer circuitry directly via dedicated signal routing that does not use the network.

22. A programmable logic device comprising:
- a plurality of blocks of generic programmable logic resources;
- a block of RAM;
- a digital signal processing block;
- a network of general interconnection resources for conveying signals between the blocks of generic programmable logic resources, the block of RAM, and the digital signal processing block; and
- input multiplexer circuitry associated with the digital signal processing block, the multiplexer circuitry being controllable to select as input signals to the digital signal processing block either (a) signals from the network or (b) signals from the block of RAM that are conveyed to the multiplexer circuitry directly via dedicated signal routing that does not use the network.

23. A programmable logic device comprising:
- a plurality of blocks of generic programmable logic resources;
- a switching block;
- a digital signal processing block;
- a network of general interconnection resources for conveying signals between the blocks of generic programmable logic resources, the switching block, and the digital signal processing block; and
- input multiplexer circuitry associated with the digital signal processing block, the multiplexer circuitry being controllable to select as input signals to the digital signal processing block either (a) signals from the network or (b) signals from the switching block that are conveyed to the multiplexer circuitry directly via dedicated signal routing that does not use the network.

* * * * *